United States Patent
Elpedes et al.

(10) Patent No.: US 7,170,151 B2
(45) Date of Patent: Jan. 30, 2007

(54) ACCURATE ALIGNMENT OF AN LED ASSEMBLY

(75) Inventors: Cresente S. Elpedes, San Jose, CA (US); Zainul Fiteri bin Aziz, Penang (MY); Paul S. Martin, Pleasanton, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 10/346,535

(22) Filed: Jan. 16, 2003

(65) Prior Publication Data

US 2004/0140543 A1  Jul. 22, 2004

(51) Int. Cl.
*H01L 23/495* (2006.01)

(52) U.S. Cl. ........................ 257/676; 257/675; 257/678; 257/706; 257/707; 257/711; 257/99; 257/100; 257/98; 257/431; 438/123

(58) Field of Classification Search ................ 257/679, 257/675, 670, 706, 707, 711, 676, 678, 99, 257/100, 98, 431; 438/123
See application file for complete search history.

(56) References Cited

U.S. PATENT DOCUMENTS

| 5,606,182 | A | | 2/1997 | Yoshida et al. |
| 5,825,794 | A | * | 10/1998 | Ogino et al. ................... 372/36 |
| 6,168,070 | B1 | * | 1/2001 | Sinkunas ................... 228/179.1 |
| 6,188,130 | B1 | * | 2/2001 | Ramirez et al. ............. 257/706 |
| 6,274,924 | B1 | | 8/2001 | Carey et al. ................. 257/676 |
| 6,335,548 | B1 | * | 1/2002 | Roberts et al. ................ 257/98 |
| 6,498,355 | B1 | * | 12/2002 | Harrah et al. .................. 257/99 |
| 6,642,652 | B2 | * | 11/2003 | Collins et al. ............... 313/512 |
| 6,791,181 | B2 | * | 9/2004 | Horie et al. ................. 257/706 |
| 2001/0032985 | A1 | | 10/2001 | Bhat et al. |
| 2002/0063329 | A1 | * | 5/2002 | Horie et al. |
| 2002/0124375 | A1 | | 9/2002 | Atia et al. |
| 2003/0168720 | A1 | * | 9/2003 | Kamada |

FOREIGN PATENT DOCUMENTS

| EP | 0 989 794 A2 | 3/2000 |
| GB | 2 062 346 A | 5/1981 |
| JP | 59-79588 | 8/1984 |

OTHER PUBLICATIONS

European Search Report, 4 pages.

* cited by examiner

*Primary Examiner*—Eddie C. Lee
*Assistant Examiner*—Junghwa Im
(74) *Attorney, Agent, or Firm*—Patent Law Group LLP; David C. Hsia

(57) ABSTRACT

An LED assembly includes a heat sink and a submount. The heat sink has a top mating surface that is solder wettable, and the submount has a bottom mating surface that is solder wettable. The top and the bottom mating surfaces have substantially the same shape and area. The submount is soldered atop the heat sink. During solder reflow, the molten solder causes the submount to align with the top mating surface of the heat sink. The LED assembly may further include a substrate having a top mating surface, and the heat sink may further include a bottom mating surface. The top and bottom mating surfaces have substantially the same shape and area. The heat sink is soldered atop the substrate. During solder reflow, the molten solder causes the heat sink to align with the top mating surface of the substrate.

7 Claims, 3 Drawing Sheets

ACCURATE ALIGNMENT OF AN LED ASSEMBLY

FIELD OF INVENTION

This invention relates to LEDs (light emitting diodes), and specifically to the accurate mounting of LEDs.

DESCRIPTION OF RELATED ART

Optical light sources such as III-nitride LEDs are sometimes mounted in a "flip chip" approach on an intermediate material or submount such as silicon. The entire package is designed to enhance the total light generating capability as well as for low thermal resistance to allow for high current density operation. Usually an epoxy compound is used to attach the submount onto a heat sink to provide support and a thermal path between the flip chip device and the LED package. A similar epoxy compound is then used to attach the LED package to the customer's wiring board. Epoxy attached devices, however, have various drawbacks: (a) the epoxy has an inherently weak thermal conducting property that leads to higher package thermal resistance; (b) poor alignment between the mating parts that leads to compromised optical performance of the device; and (c) formation of a fillet on the side of the chip that can lead to an electrical short. Thus, what is needed is an LED assembly that addresses these problems.

SUMMARY

In one embodiment of the invention, an LED assembly includes a heat sink and a submount. The heat sink has a top mating surface that is solder wettable and the submount has a bottom mating surface that is solder wettable. The top and bottom mating surfaces have substantially the same shape and area. The submount is soldered atop the heat sink. During a reflow process, the molten solder causes the submount to align with the top mating surface of the heat sink.

In one embodiment, the assembly further includes a substrate having a second top mating surface that is solder wettable, and the heat sink further includes a second bottom mating surface that is solder wettable. The second top and bottom mating surfaces have substantially the same shape and area. The heat sink is soldered atop the substrate. During the reflow process, the molten solder causes the heat sink to align with the second top mating surface of the substrate.

DETAILED DESCRIPTION

In one embodiment of the invention, a submount is mounted on a heat sink with solder instead of epoxy. The submount has a solderable bottom mating surface and the heat sink has a solderable top mating surface of substantially the same shape and area. During a solder reflow, the molten solder causes the submount to align with the heat sink. Furthermore, the heat sink is mounted on a substrate with solder instead of epoxy. The heat sink has a solderable bottom mating surface and the substrate has a solderable top mating surface of substantially the same shape and area. Again, during a solder reflow, the molten solder causes the heat sink to align with the substrate.

Figure 1A:
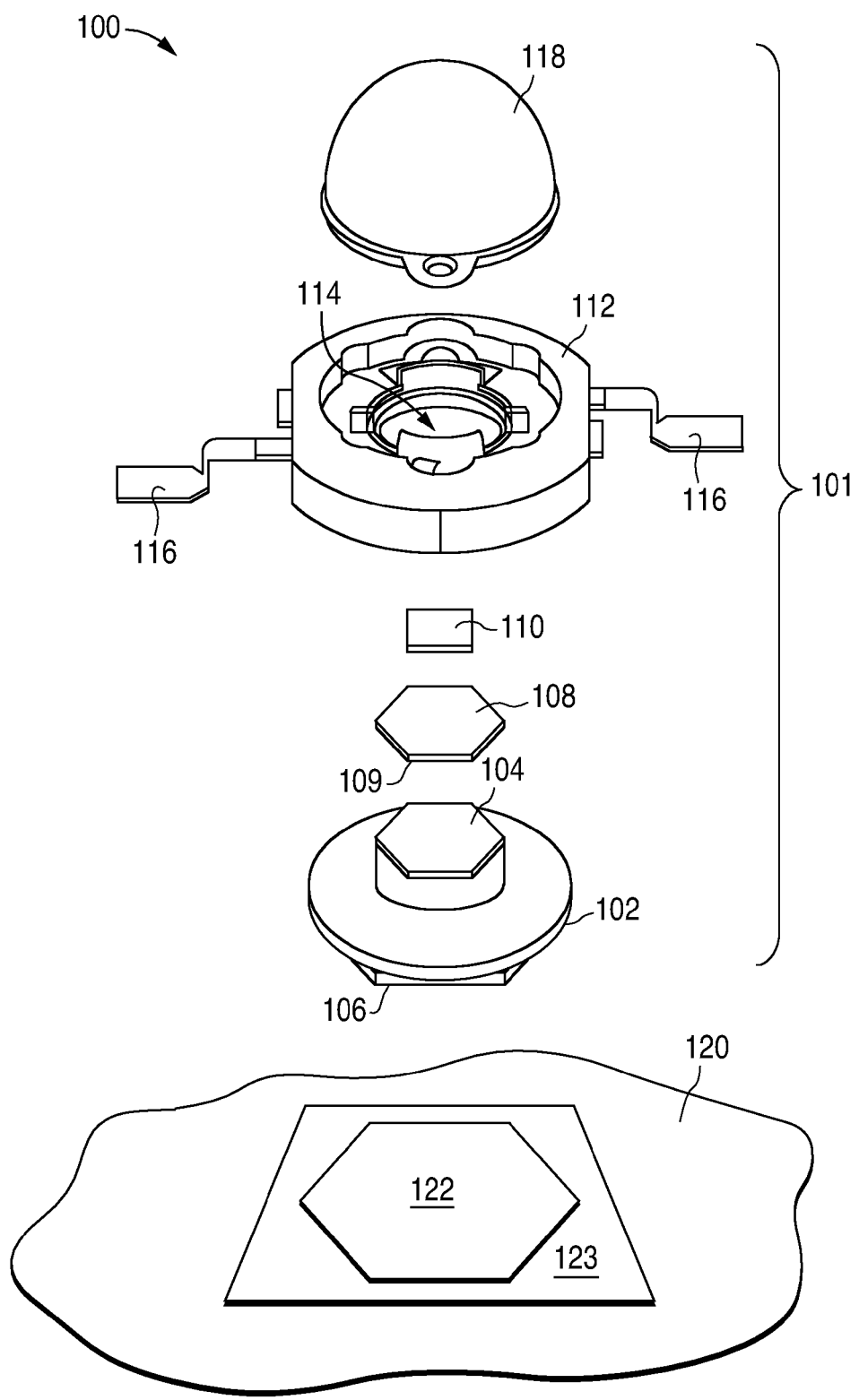
FIGS. 1A and 1B illustrate exploded views of an LED package 100 in one embodiment.
Figure 1B:
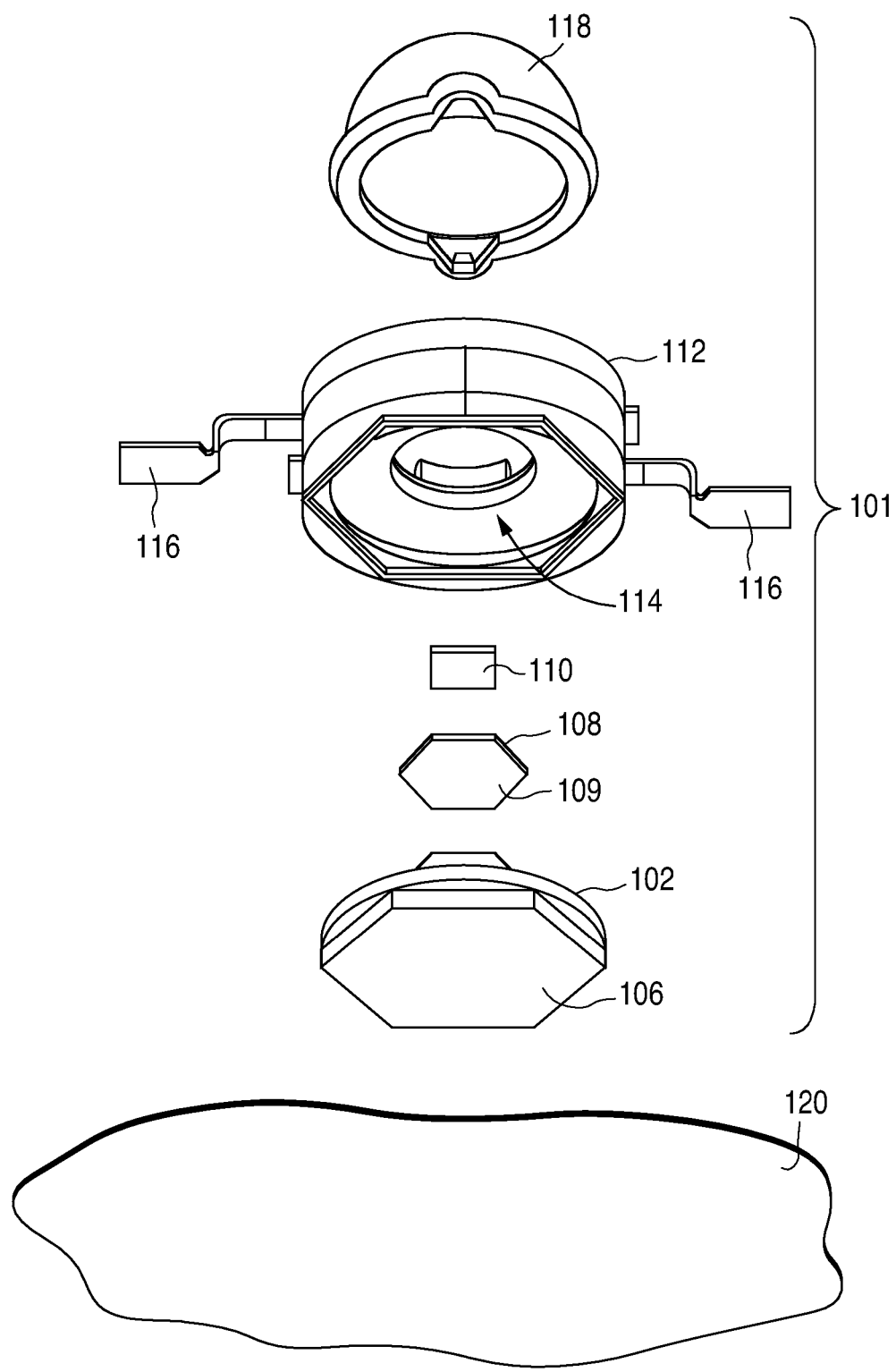
Figure 2:
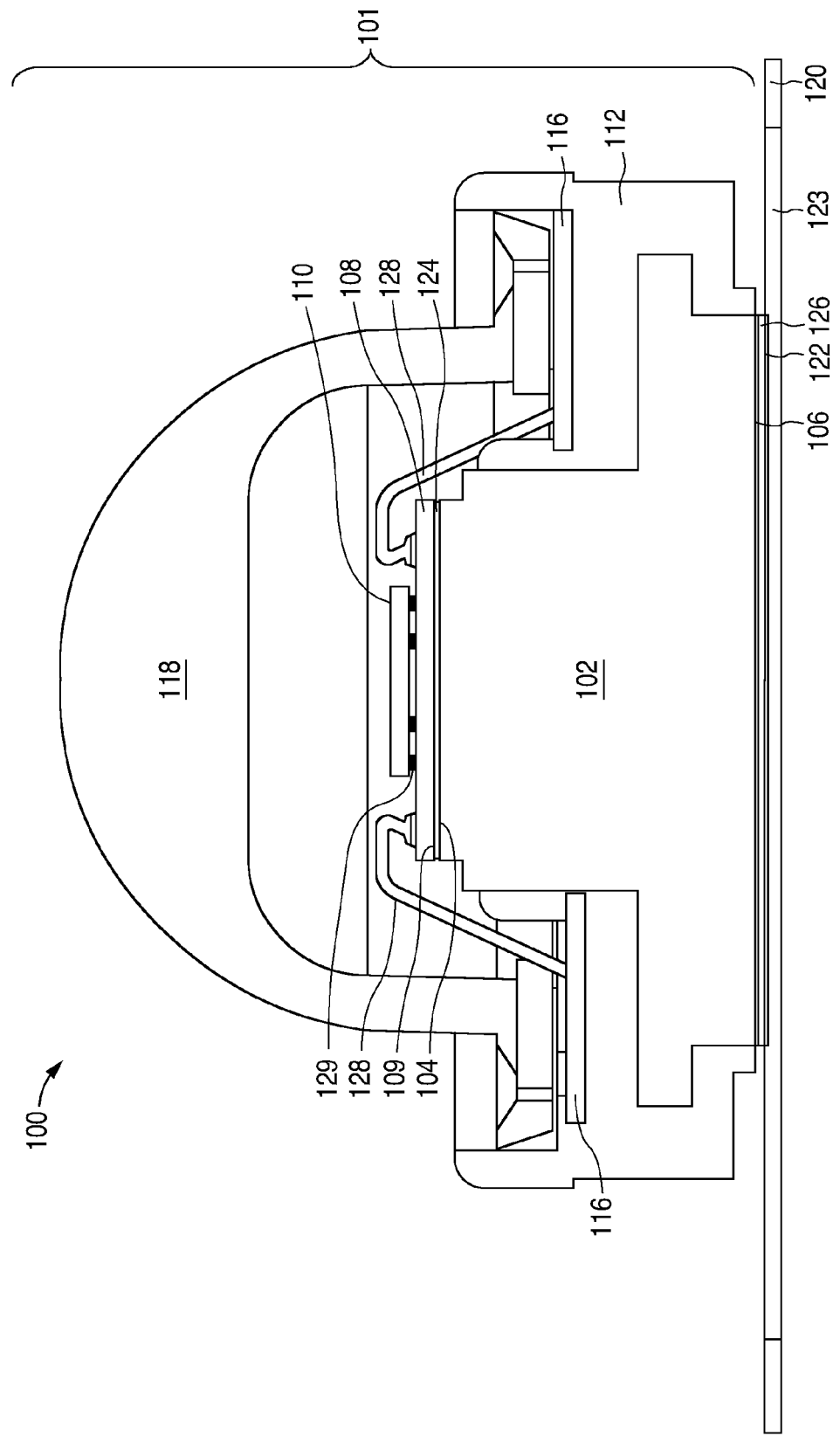
FIG. 2 illustrates a cross-section of LED package 100 in the embodiment.

FIGS. 1A and 1B illustrate exploded views of an LED assembly 100 in one embodiment. FIG. 2 illustrates a cross-section view of an assembled LED assembly 100. LED assembly 100 includes an LED package 101 and a substrate 120.

LED package 101 includes an LED die 110 that is mounted on a submount 108. Submount 108 may be electrically conductive or insulating. Submount 108 may be made of silicon, copper, silver, diamond, aluminum, tungsten, molybdenum, beryllium, alumina, aluminum nitride, beryllium oxide, boron nitride or other thermally conductive materials, compounds, or composites. In the present embodiment, LED die 110 is bonded to submount 108 by soldering a ball grid array on submount 108 to contact pads on LED die 110 with a solder 129 (FIG. 2). Submount 108 is formed with conductive traces that couple LED die 110 to bond wire contacts. Zener diodes may be formed in the path of the traces to protect against electrostatic discharge.

Submount 108 is mounted on a heat sink 102 (also called a "slug"). Slug 102 may be made of silicon, copper, silver, diamond, aluminum, tungsten, molybdenum, beryllium, alumina, aluminum nitride, beryllium oxide, boron nitride or other thermally conductive materials, compounds, or composites. Slug 102 has a top mating surface 104 (shown in FIGS. 1A and 2) and a bottom mating surface 106 that are solder wettable. If slug 102 is an inherently non-wettable material, mating surfaces 104 and 106 can be made wettable by depositing a layer of wettable material such as silver, nickel, gold, tin, copper, or palladium on slug 102. In the present embodiment, mating surfaces 104 and 106 are raised surfaces of slug 102. In other embodiments, mating surfaces 104 and 106 may be wettable surfaces that are level and contained within non-wettable surfaces. If slug 102 is an inherently wettable material, mating surfaces 104 and 106 can be defined by a layer of non-wettable material such as a solder mask or an oxide deposited on slug 102.

A solder paste is deposited on mating surface 104, and submount 108 is placed on the solder paste atop mating surface 104. Submount 108 has a bottom mating surface 109 that is solder wettable and has substantially the same shape and size as mating surface 104. If submount 108 is an inherently non-wettable material, mating surface 109 can be made wettable by depositing a layer of wettable material such as silver, nickel, gold, tin, copper, or palladium on the bottom of submount 108. The solder paste is heated in a conventional reflow process. As mating surface 109 has substantially the same shape and area as mating surface 104, the molten solder aligns mating surface 109 to mating surface 104 by the surface tension of the molten solder. In one embodiment, two surfaces have substantially the same shape and area when the smaller circumference is 50% or more of the larger circumference. In another embodiment, two surfaces have substantially the same shape and area when the molten solder can align them with an accuracy of 20 microns or better.

At the end of the reflow process, the solder paste becomes a solder 124 (FIG. 2) that bonds submount 108 to mating surface 104. Thus, LED die 110 can be accurately aligned and bonded to slug 102. In the present embodiment, mating surfaces 109 and 104 are both hexagons. In other embodiments, alternative geometric features are used provided that the mating surfaces are substantially the same shape and size.

LED package 100 further includes a body 112 that defines a cavity 114 (FIGS. 1A and 1B). Body 112 may be made of any dielectric material such as plastic. Slug 102 is mounted to body 112 inside cavity 114. Body 112 includes leads 116 that pass electrical signals between LED package 100 and other components. Bond wires 128 (FIG. 2) couple submount 108 to leads 116. Body 112 further includes a lens 118 fitted on body 112. An encapsulant may fill lens 118 to protect LED die 110.

LED package 100 can be mounted on a thermally conductive substrate 120. Substrate 120 has a top mating surface 122 that is solder wettable. In the present embodiment, mating surface 122 is level and contained within a non-wettable surface 123. Mating surface 122 can be made wettable by depositing a layer of wettable material such as silver, nickel, gold, tin, copper, or palladium on substrate 120. Non-wettable surface 123 can be made by depositing a layer of non-wettable material such as a solder mask or an oxide on substrate 120. In other embodiments, mating surface 122 may be a raised surface of substrate 120.

A solder paste is deposited on mating surface 122, and slug 102 is placed on the solder paste atop mating surface 122. The slug mating surface 106 has substantially the same shape and area as mating surface 122. The solder paste is heated in a conventional reflow process. As mating surface 106 has substantially the same shape and area as mating surface 122, the molten solder aligns mating surface 106 to mating surface 122. At the end of the reflow process, the solder paste becomes a solder 126 (FIG. 2) that bonds slug LED package 101 to mating surface 122. Thus, LED package 101 can be accurately aligned and bonded to substrate 120. In the present embodiment, mating surfaces 106 and 122 are both hexagons. In other embodiments, alternative geometric features are used provided that the mating surfaces are substantially the same shape and size.

Solders 124 and 126 have lower thermal resistances than epoxy so they allow more heat to be conducted away from LED package 100 to substrate 120 for higher temperature operation. Solders 124 and 126 are also more robust and reliable at high temperature operation than epoxy. In addition, solder 124 is also less likely to short submount 108 to slug 102 because any excessive solder will flow down the perimeter of raised mating surface 104 and away from the conductive top surface of submount 108 and the attached bond wires 128.

In one embodiment, the liquidous temperature of solder 129 is higher than that of solder 124, and the liquidous temperature of solder 124 is higher than that of solder 126. This prevents the subsequent reflow processes from disturbing the soldered parts from previous reflow processes.

The LED die need not be a flip chip to make use of the invention.

Various other adaptations and combinations of features of the embodiments disclosed are within the scope of the invention. For example, the solder paste may be applied to any one or both of the two wettable mating surfaces. Numerous embodiments are encompassed by the following claims.

What is claimed is:

1. An LED assembly, comprising:
   a substrate comprising a first top surface that is solder wettable;
   a heat sink comprising a flange and a body protruding above the flange, the flange comprising a first bottom surface that is raised below the flange and solder wettable, the body comprising a second top surface that is raised above the body and solder wettable, the first bottom surface having substantially the same shape and area as the first top surface of the substrate, the heat sink being mounted atop the substrate by a first solder between the first bottom surface and the first top surface;
   a submount comprising a second bottom surface that is solder wettable, the second bottom surface having substantially the same shape and area as the second top surface of the heat sink, the submount being mounted atop the heat sink by a second solder between the second bottom surface and the second top surface;
   an LED die mounted atop the submount;
   an insulating body defining a cavity for receiving the heat sink;
   metal leads attached to the insulating body; and
   bond wires coupling the submount to the metal leads.

2. The assembly of claim 1, wherein at least one of the first top surface and the second top surface has a hexagon shape.

3. The assembly of claim 1, wherein the LED die is a flip chip.

4. The assembly of claim 1, wherein the LED die includes contact pads, wherein the contact pads are mounted to conductors atop the submount by a third solder.

5. The assembly of claim 4, wherein the third solder has a higher liquidous temperature than the second solder, and the second solder has a higher liquidous temperature than the first solder.

6. The assembly of claim 1, wherein at least one of (1) the first bottom surface and the first top surface and (2) the second bottom surface and the second top surface have substantially the same shape and area when one circumference is at least 50% of another circumference.

7. The assembly of claim 1, wherein at least one of (1) the first bottom surface and the first top surface and (2) the second bottom surface and the second top surface have substantially the same shape and area when the first solder aligns the top and bottom mating surfaces with an accuracy of 20 microns or better.

* * * * *